United States Patent
Kitada et al.

(10) Patent No.: US 10,181,555 B2
(45) Date of Patent: Jan. 15, 2019

(54) PIEZOELECTRIC ELEMENT AND PIEZOELECTRIC ELEMENT APPLIED DEVICE

(71) Applicant: SEIKO EPSON CORPORATION, Tokyo (JP)

(72) Inventors: Kazuya Kitada, Suwa (JP); Koji Sumi, Shiojiri (JP); Tomohiro Sakai, Matsumoto (JP); Toshiaki Takahashi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/896,439

(22) Filed: Feb. 14, 2018

(65) Prior Publication Data

US 2018/0233656 A1 Aug. 16, 2018

(30) Foreign Application Priority Data

Feb. 15, 2017 (JP) .................................. 2017-026394

(51) Int. Cl.
| | |
|---|---|
| *B41J 2/14* | (2006.01) |
| *H01L 41/187* | (2006.01) |
| *H01L 41/09* | (2006.01) |
| *H01L 41/08* | (2006.01) |

(52) U.S. Cl.
CPC ...... *H01L 41/1873* (2013.01); *B41J 2/14201* (2013.01); *H01L 41/0805* (2013.01); *H01L 41/09* (2013.01)

(58) Field of Classification Search
CPC ............... B41J 2/14201; B41J 2/14274; B41J 2/14209; B41J 2/14233; H01L 41/0805; H01L 41/09; H01L 41/1873
See application file for complete search history.

(56) References Cited

U.S. PATENT DOCUMENTS

| | | |
|---|---|---|
| 2009/0189490 A1 | 7/2009 | Shibata et al. |
| 2009/0302715 A1 | 12/2009 | Shibata et al. |
| 2010/0293782 A1 | 11/2010 | Yamazaki et al. |
| 2011/0006643 A1 | 1/2011 | Shibata et al. |

(Continued)

FOREIGN PATENT DOCUMENTS

| | | |
|---|---|---|
| EP | 3098868 A1 | 11/2016 |
| JP | 2009-200468 | 9/2009 |

(Continued)

OTHER PUBLICATIONS

European Search Report issued in Application No. 18155942 dated Jun. 28, 2018.

*Primary Examiner* — Juanita D Jackson

(74) *Attorney, Agent, or Firm* — Workman Nydegger

(57) ABSTRACT

A piezoelectric element includes a first electrode, a second electrode, and a thin piezoelectric layer. The thin piezoelectric layer is provided between the first electrode and the first electrode, and is formed of a perovskite type compound oxide which contains potassium, sodium, and niobium. In the piezoelectric layer, in an X-ray diffraction pattern obtained by θ–2θ measurement, peaks derived from a (002) plane and a (200) plane are provided in a range in which 2θ is from 45° to 47°, a peak position of the peak on a high angle side among the peaks satisfies 46.0°≤2θ≤46.5°, and a difference of 2θ between the peak on the high angle side and the peak on a low angle side is greater than 0.60°.

12 Claims, 5 Drawing Sheets

(56) References Cited

U.S. PATENT DOCUMENTS

| | | | | |
|---|---|---|---|---|
| 2011/0221829 A1* | 9/2011 | Wang | ................... | B41J 2/14233 |
| | | | | 347/68 |
| 2013/0106242 A1* | 5/2013 | Shibata | ................ | C04B 35/495 |
| | | | | 310/311 |
| 2016/0276572 A1 | 9/2016 | Sumi et al. | | |

FOREIGN PATENT DOCUMENTS

| | | |
|---|---|---|
| JP | 2011-003537 | 1/2011 |
| JP | 2012-124233 | 6/2012 |
| JP | 2012-169467 | 9/2012 |
| JP | 2016-178253 | 10/2016 |

* cited by examiner

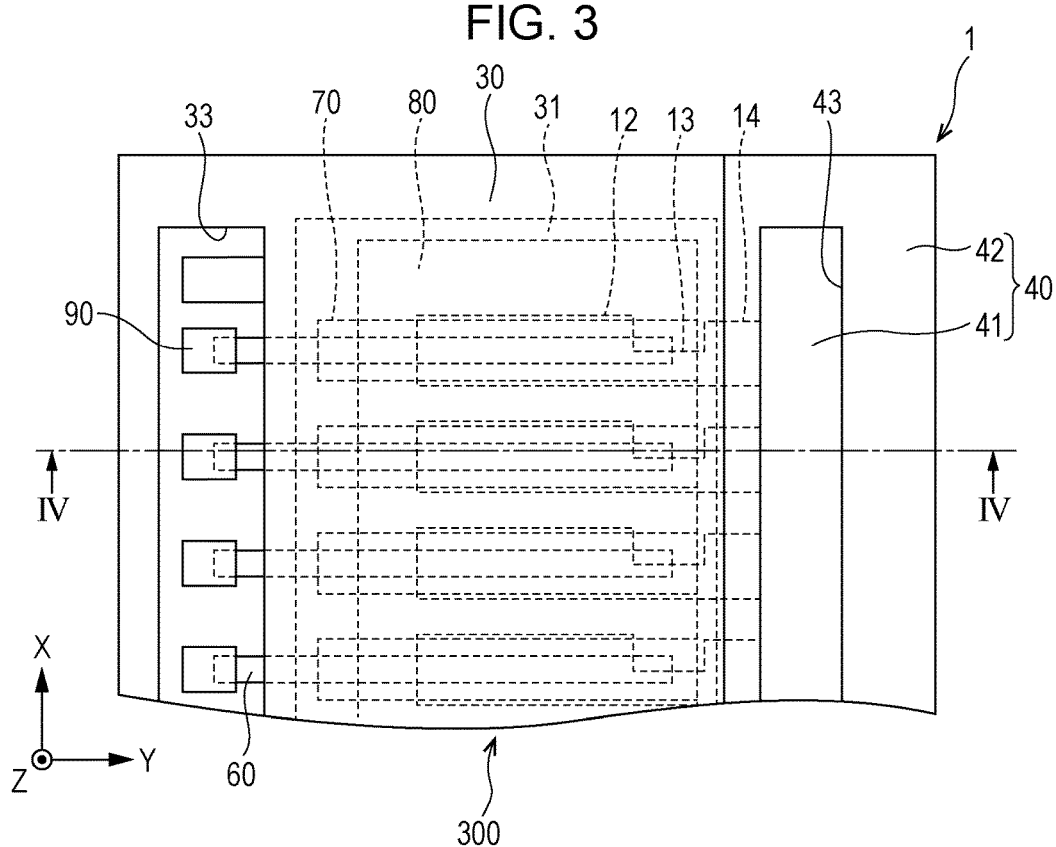
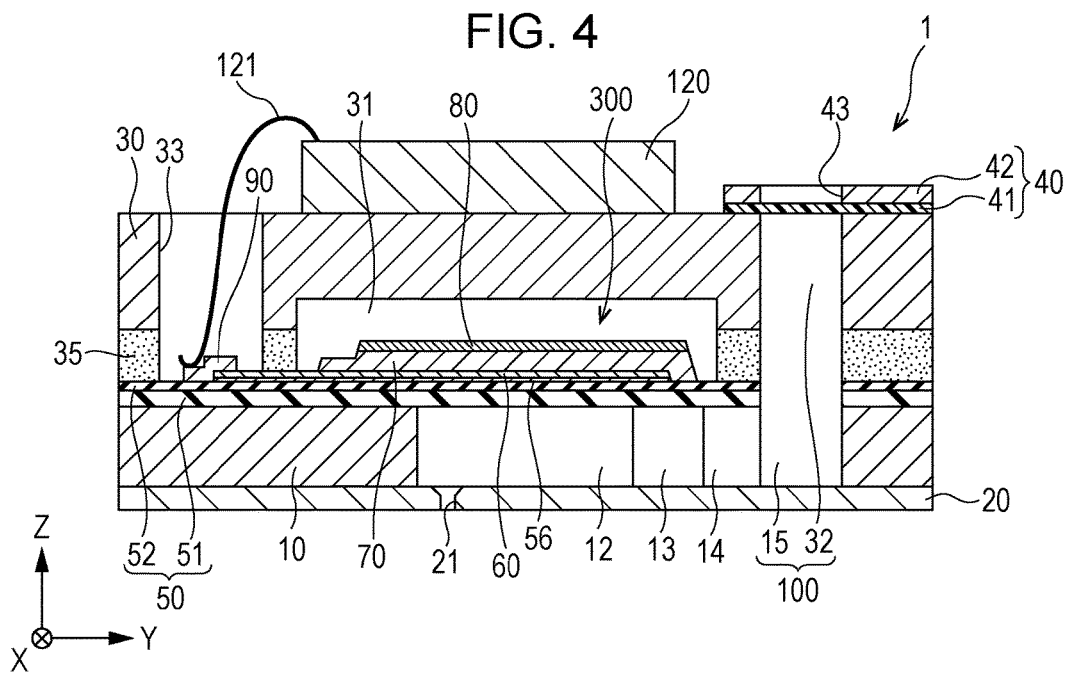

PIEZOELECTRIC ELEMENT AND PIEZOELECTRIC ELEMENT APPLIED DEVICE

This application claims priority under 35 U.S.C. § 119 to Japanese Patent Application No. 2017-026394 filed on Feb. 15, 2017, the entire disclosure of which is expressly incorporated by reference herein.

BACKGROUND

1. Technical Field

The present invention relates to a piezoelectric element which includes a first electrode, a piezoelectric layer, and a second electrode, and a piezoelectric element applied device which includes the piezoelectric element.

2. Related Art

Generally, a piezoelectric element includes a piezoelectric layer and two electrodes. The piezoelectric layer has electromechanical conversion characteristics. The piezoelectric layer is interposed between the two electrodes. A device (piezoelectric element applied device) which uses such a piezoelectric element as a driving source has recently been actively developed. As one of the piezoelectric element applied devices, for example, a liquid ejecting head represented by an ink jet recording head, a MEMS element represented by a piezoelectric MEMS element, an ultrasonic measurement device represented by an ultrasonic sensor and the like, and a piezoelectric actuator device are provided.

As a material (piezoelectric material) of a piezoelectric layer of a piezoelectric element, lead zirconate titanate (PZT) is known. However, from a viewpoint of reducing an environmental load, a non-lead-based piezoelectric material in which the content of lead is suppressed has been developed. As one of such non-lead-based piezoelectric materials, for example, as disclosed in JP-A-2011-03537 or in Yiping Guo et al. Appl. Phys. Lett. 85, 4121 (2004), potassium sodium niobate (KNN; (K, Na)NbO$_3$) is proposed (see JP-A-2011-03537).

A technology in which the half width of X-ray diffraction intensity distribution corresponding to (100) orientation of a KNN piezoelectric layer on a second electrode side is set to be smaller than the half width of X-ray diffraction intensity distribution corresponding to (100) orientation of a KNN piezoelectric layer on a first electrode side, and thus durability is improved is proposed (see JP-A-2012-124233).

A piezoelectric element in which the diffraction peak position (2θ) of an X-ray derived from the (100) plane of the KNN piezoelectric layer is set to be from 22.51° to 22.95°, and thus linearity of a potential to an applied voltage is improved is provided (see JP-A-2016-178253).

However, in the KNN-based piezoelectric element, there is a problem in that displacement characteristics sufficient for the practical use are not obtained yet, and cracks occur in a thin film. In particular, it is difficult to suppress the occurrence of cracks. In addition, it is very difficult to realize both an increase of the displacement amount and suppression of the occurrence of cracks. Thus, a KNN thin film which realizes the suppression of the occurrence of cracks, furthermore, realizes both the increase of the displacement amount and the suppression of the occurrence of cracks is required.

Such a problem is not limited to a piezoelectric element used in a piezoelectric actuator which is mounted in a liquid ejecting head represented by an ink jet recording head, and similarly also occurs in a piezoelectric element used in other piezoelectric element applied devices.

SUMMARY

An advantage of some aspects of the invention is to provide a piezoelectric element and a piezoelectric element applied device which realize the suppression of the occurrence of cracks and the increase of the displacement amount.

According to an aspect of the invention, there is provided a piezoelectric element which includes a first electrode, a second electrode, and a thin piezoelectric layer. The thin piezoelectric layer is provided between the first electrode and the second electrode and is formed of a perovskite type compound oxide which contains potassium, sodium, and niobium. In the piezoelectric layer, in an X-ray diffraction pattern obtained by θ-2θ measurement, peaks derived from a (002) plane and a (200) plane are provided in a range in which 2θ is from 45° to 47°, a peak position of the peak on a high angle side among the peaks satisfies 46.0°≤2θ 46.5°, and a difference of 2θ between the peak on the high angle side and the peak on a low angle side is greater than 0.60°.

In the aspect, since, in the X-ray diffraction pattern obtained by θ-2θ measurement, the peaks derived from a (002) plane and a (200) plane are provided in a range in which 2θ is from 45° to 47°, the peak position of the peak on the high angle side among the peaks satisfies 46.0°≤2θ≤46.5°, and the difference of 2θ between the peak on the high angle side and the peak on the low angle side is greater than 0.60°, it is possible to suppress the occurrence of cracks.

Here, the compound oxide may contain manganese. In this configuration, a piezoelectric element having improved piezoelectric characteristics is obtained.

Here, it is preferable that the composition of the compound oxide be represented by the following formula.

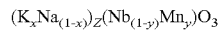

$(K_xNa_{(1-x)})_Z(Nb_{(1-y)}Mn_y)O_3$ 0.1≤x≤0.9, 0≤y≤0.02, and 0.9≤z≤1.2

In particular, it is preferable that x, y, and z in the formula be indicated as follows.

0.3≤x≤0.6, 0.003≤y≤0.01, and 0.95≤z≤1.1

The first electrode and the second electrode may be formed of at least one selected from Pt, Ir, and oxides thereof. Accordingly, it is possible to realize a piezoelectric element having improved piezoelectric characteristics.

It is preferable that the peak on the high angle side among the peaks have peak intensity which is higher than that of the peak on the low angle side. In this configuration, it is possible to suppress the occurrence of cracks and to increase the displacement amount.

According to another aspect of the invention, there is provided a piezoelectric element applied device including the piezoelectric element.

In the aspect, it is possible to realize both an increase of the displacement amount and suppression of the occurrence of cracks.

BRIEF DESCRIPTION OF THE DRAWINGS

The invention will be described with reference to the accompanying drawings, wherein like numbers reference like elements.

FIG. 3 is a plan view illustrating the recording head.

FIG. 4 is a cross-sectional view illustrating the recording head.

DESCRIPTION OF EXEMPLARY EMBODIMENTS

Figure 1:
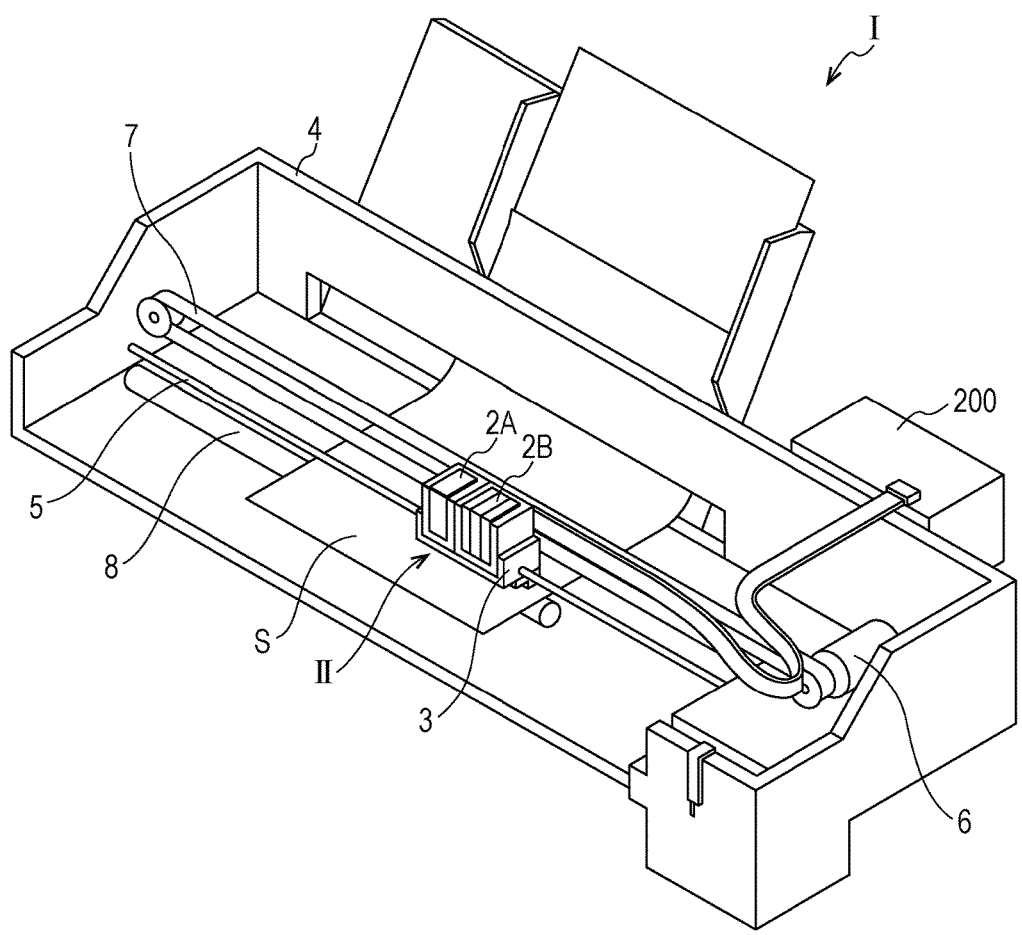
FIG. 1 is a diagram illustrating a schematic configuration of a recording apparatus.

Hereinafter, an embodiment according to the invention will be described with reference to the drawings. The following descriptions are used for describing an aspect of the invention, and may be arbitrarily changed in a range of the invention. In the drawings, components denoted by the same reference numerals indicate the same member as each other, and descriptions thereof will be appropriately omitted. In FIGS. 2 to 11, X, Y, and Z indicate three spatial axes perpendicular to each other. In the specification, descriptions will be made by using directions along the three spatial axes, which are respectively set as an X direction, a Y direction, and a Z direction. The Z direction indicates a thickness direction or a layered direction of a plate, a layer, and a film. The X direction and the Y direction indicate an in-plane direction of the plate, the layer, and the film.

Embodiment 1

FIG. 1 illustrates an ink jet type recording apparatus which is an example of a liquid ejecting apparatus. The liquid ejecting apparatus includes a recording head which is an example of a piezoelectric element applied device according to an embodiment of the invention. As illustrated in FIG. 1, in an ink jet type recording apparatus I, an ink jet recording head unit (head unit) II which includes a plurality of ink jet recording heads is provided so as to be attachable to cartridges 2A and 2B. The cartridges 2A and 2B constitute an ink supply section. A carriage 3 having the head unit II mounted therein is provided with a carriage shaft 5 so as to be movable in a shaft direction. The carriage shaft 5 is attached to a main body 4 of the apparatus. For example, the carriage 3 has a function of discharging a black ink composite and a color ink composite.

A driving force of a driving motor 6 is transferred to the carriage 3 through a plurality of gears and timing belts 7 (not illustrated). Thus, the carriage 3 having the head unit II mounted therein is moved along the carriage shaft 5. A transporting roller 8 is provided as a transporting section in the main body 4 of the apparatus. A recording sheet S which is a recording medium such as paper is transported by the transporting roller 8. The transporting section that transports the recording sheet S is not limited to the transporting roller, and may be a belt, a drum, or the like.

According to such an ink jet type recording apparatus I, since the ink jet type recording apparatus I includes the ink jet recording head (simply also referred to the "recording head" below), it is possible to manufacture the ink jet type recording apparatus I cheaply. Because improvement of displacement characteristics of the piezoelectric element constituting a piezoelectric actuator is expected, it is possible to improve ejecting characteristics.

Figure 2:
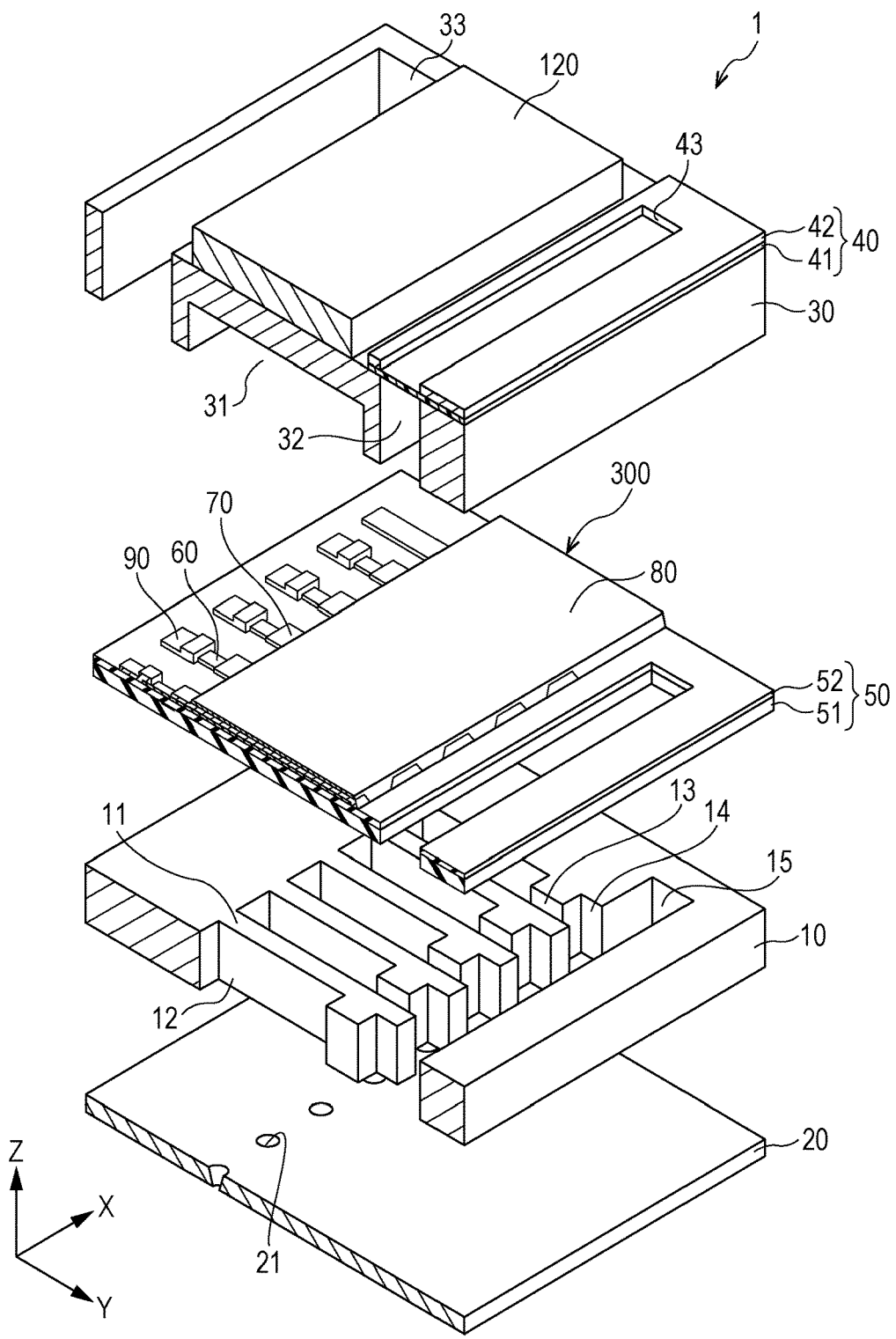
FIG. 2 is an exploded perspective view illustrating a recording head.

An example of a recording head 1 mounted in the above-described ink jet type recording apparatus I will be described with reference to FIGS. 2 to 4. FIG. 2 is an exploded perspective view illustrating the recording head which is an example of a liquid ejecting unit according to the embodiment. FIG. 3 is a plan view of a piezoelectric element side of a passage formation substrate. FIG. 4 is a cross-sectional view taken along line IVA-IVA in FIG. 3.

The passage formation substrate 10 (referred to as a "substrate 10") is formed from, for example, a silicon single crystal substrate. In the passage formation substrate 10, pressure generation chambers 12 are formed. In each of the pressure generation chambers 12 obtained by subdivision with a plurality of partitions 11, a plurality of nozzle openings 21 for discharging an ink of the same color are arranged in the X direction.

In the substrate 10, an ink supply path 13 and a communication path 14 are formed on one end portion side of the pressure generation chamber 12 in the Y direction. The ink supply path 13 is configured in such a manner that one side of the pressure generation chamber 12 is narrowed from the X direction and thus an opening area of the pressure generation chamber 12 becomes small. The communication path 14 has substantially the same width as the pressure generation chamber 12 in the X direction. A communication portion 15 is formed on the outside (+Y direction side) of the communication path 14. The communication portion 15 constitutes a portion of a manifold 100. The manifold 100 functions as a common ink chamber for the pressure generation chambers 12. In this manner, a fluid passage which is formed from the pressure generation chamber 12, the ink supply path 13, the communication path 14, and the communication portion 15 is formed in the substrate 10.

For example, a SUS nozzle plate 20 is bonded to one surface (surface on a −Z direction side) of the substrate 10. The nozzle openings 21 are arranged in the nozzle plate 20 in the X direction. The nozzle openings 21 respectively communicate with the pressure generation chambers 12. The nozzle plate 20 may be bonded to the substrate 10 by using an adhesive, a heat-welding film, or the like.

A vibration plate 50 is formed on another surface (surface on a +Z direction) of the substrate 10. The vibration plate 50 includes, for example, an elastic film 51 formed on the substrate 10, and an insulating film 52 formed on the elastic film 51. The elastic film 51 is formed of silicon dioxide ($SiO_2$), for example. The insulating film 52 is formed of zirconium dioxide ($ZrO_2$), for example. The elastic film 51 may not be a member separate from the substrate 10. A portion of the substrate 10 is processed so as to be thin, and a part obtained by the processing may be used as the elastic film.

A piezoelectric element 300 which includes a first electrode 60, a piezoelectric layer 70, and a second electrode 80 is formed on the insulating film 52 with an adhesive layer 56 interposed between the piezoelectric element 300. The adhesive layer 56 is used for improving adhesiveness between the first electrode 60 and the substrate. The adhesive layer 56 may be formed by using, for example, titanium oxide (TiO$_x$), titanium (Ti), silicon nitride (SiN), or the like. The adhesive layer 56 may be omitted. An orientation control layer (also referred to as a seed layer) for controlling an orientation of the piezoelectric layer 70 may be provided on the adhesive layer 56 or in a configuration in which the adhesive layer 56 is omitted.

In the embodiment, displacement of the piezoelectric layer 70 having electromechanical conversion characteristics causes displacement to occur in the vibration plate 50 and the first electrode 60. That is, in the embodiment, the vibration plate 50 and the first electrode 60 substantially have a function as a vibration plate. The elastic film 51 and the insulating film 52 may be omitted and only the first electrode 60 may function as the vibration plate. In a case where the first electrode 60 is directly provided on the substrate 10, the first electrode 60 is preferably protected by using an insulating protective film and the like, so as not to bring an ink into contact with the first electrode 60.

The piezoelectric layer 70 is provided between the first electrode 60 and the second electrode 80. The piezoelectric layer 70 is formed so as to have a width wider than the first electrode 60 in the X direction. The piezoelectric layer 70 in the Y direction is formed so as to have a width wider than the length of the pressure generation chamber 12 in the Y direction. An end portion (end portion on the +Y direction) of the ink supply path 13 side of the piezoelectric layer 70 in the Y direction is formed over the outside of an end portion of the first electrode 60. That is, another end portion (end portion on the +Y direction side) of the first electrode 60 is covered with the piezoelectric layer 70. One end portion (end portion on a −Y direction side) of the piezoelectric layer 70 is provided on the inner side of one end portion (end portion on the −Y direction side) of the first electrode 60. That is, the one end portion (end portion on the −Y direction side) of the first electrode 60 is not covered with the piezoelectric layer 70.

The second electrode 80 is provided over the piezoelectric layer 70, the first electrode 60, and the vibration plate 50 in the X direction. That is, the second electrode 80 is configured as a common electrode which is commonly used for a plurality of piezoelectric layers 70. Instead of the second electrode 80, the first electrode 60 may be used as the common electrode.

A protective substrate 30 is bonded to the substrate 10 in which the piezoelectric element 300 is formed, by using an adhesive 35. The protective substrate 30 includes a manifold portion 32. At least a portion of the manifold 100 is configured by the manifold portion 32. The manifold portion 32 according to the embodiment is formed in a width direction (X direction) of the pressure generation chamber 12, so as to pass through the protective substrate 30 in a thickness direction (Z direction). As described above, the manifold portion 32 communicates with the communication portion 15 of the substrate 10. With the configuration, the manifold 100 which functions as the common ink chamber for the pressure generation chambers 12 is configured.

A piezoelectric element holding portion 31 is formed in an area including the piezoelectric element 300 in the protective substrate 30. The piezoelectric element holding portion 31 has a space which is large enough not to impede the movement of the piezoelectric element 300. The space may be sealed or may not be sealed. A through-hole 33 which passes through the protective substrate 30 in the thickness direction (Z direction) is provided in the protective substrate 30. An end portion of the lead electrode 90 is exposed in the through-hole 33.

A driving circuit 120 which functions as a signal processing unit is fixed to the protective substrate 30. The driving circuit 120 may use, for example, a circuit board or a semiconductor integrated circuit (IC). The driving circuit 120 and the lead electrode 90 are electrically connected to each other through a connection wire 121. The driving circuit 120 may be electrically connected to a printer controller 200. Such a driving circuit 120 functions as a control section according to the embodiment.

A compliance substrate 40 which is formed from a sealing film 41 and a fixation plate 42 is bonded to the protective substrate 30. An area of the fixation plate 42, which faces the manifold 100, functions as an opening portion 43 obtained by completely removing the fixation plate 42 in the thickness direction (Z direction). One surface (surface on the +Z direction side) of the manifold 100 is sealed only by the sealing film 41 having flexibility.

Next, details of the piezoelectric element 300 will be described. The piezoelectric element 300 includes the first electrode 60, the second electrode 80, and the piezoelectric layer 70 provided between the first electrode 60 and the second electrode 80. The thickness of the first electrode 60 is about 50 nm. The piezoelectric layer 70 is a so-called thin-film piezoelectric body. That is, the piezoelectric layer 70 has a thickness of 50 nm to 2000 nm. The thickness of the second electrode 80 is about 50 nm. The value of the thickness of the constituents exemplified herein is only an example, and may be changed in a range without deviating from the gist of the invention.

As the material of the first electrode 60 and the second electrode 80, precious metal such as platinum (Pt) and iridium (Ir) or oxides thereof are suitable. The material of the first electrode 60 and the material of the second electrode 80 may be materials having conductivity. The material of the first electrode 60 and the material of the second electrode 80 may be the same as each other, or may be different from each other.

The piezoelectric layer 70 is formed by a thin film as described above, and is formed by a solution method (also referred to as a liquid phase method or a wet type method) such as a MOD method and a sol-gel method, or by a vapor phase method such as a sputtering method. In the embodiment, the piezoelectric layer 70 is formed by using a solution method, and is formed of a compound oxide of a perovskite structure. The perovskite structure is indicated by a general formula ABO$_3$. The compound oxide contains potassium (K), sodium (Na), and niobium (Nb). That is, the piezoelectric layer 70 includes a piezoelectric material formed of a KNN-based compound oxide which is represented by the following formula (1).

$$(K_x, Na_{1-x})NbO_3 \ldots \quad (1)$$

$$(0.1 \leq X \leq 0.9)$$

The compound oxide represented by the formula (1) is so-called a KNN-based compound oxide. The KNN-based compound oxide is a non-lead-based piezoelectric material in which the content of lead (Pb) and the like is suppressed. Thus, the KNN-based compound oxide has excellent biocompatibility, and has a small environmental load. Because the KNN-based compound oxide has excellent piezoelectric characteristics among non-lead-based piezoelectric materials, the KNN-based compound oxide is advantageous for improving various types of characteristics. In addition, the KNN-based compound oxide has the Curie temperature higher than that of other non-lead-based piezoelectric materials (for example, BNT-BKT-BT; [(Bi, Na)TiO$_3$]–[(Bi,K)

TiO₃]–[BaTiO₃]), and occurrence of depolarization due to an increase of a temperature is also difficult. Thus, using at a high temperature is possible.

In the formula (1), the content of K is preferably from 10 mol % to 90 mol % with respect to the total amount of metal elements constituting an A site (in other words, the content of Na is preferably from 10 mol % to 90 mol % with respect to the total amount of the metal elements constituting the A site). That is, in the formula (1), a range of $0.1 \leq x \leq 0.9$ is preferable. According to this range, a compound oxide having a composition which is useful for piezoelectric characteristics is obtained. The content of K is preferably from 30 mol % to 60 mol % with respect to the total amount of the metal elements constituting the A site (in other words, the content of Na is preferably from 40 mol % to 70 mol % with respect to the total amount of the metal elements constituting the A site). That is, a range of $0.30 \leq x \leq 0.60$ is more preferable in the formula (1). According to this range, a compound oxide having a composition which is more useful for piezoelectric characteristics is obtained.

The piezoelectric material forming the piezoelectric layer 70 may be the KNN-based compound oxide, and is not limited to the composition represented by the formula (1). For example, another metal element (additive) may be included in an A site or a B site of potassium sodium niobate. Examples of such an additive include manganese (Mn), lithium (Li), barium (Ba), calcium (Ca), strontium (Sr), zirconium (Zr), titanium (Ti), bismuth (Bi), tantalum (Ta), antimony (Sb), iron (Fe), cobalt (Co), silver (Ag), magnesium (Mg), zinc (Zn), and copper (Cu).

One or more types of this additive may be included. Generally, the amount of the additive is equal to or smaller than 20%, preferably equal to or smaller than 15%, and more preferably equal to or smaller than 10%, with respect to the total amount of an element which functions as the main component. Using the additive causes various types of characteristics to be improved, and thus configurations or functions are easily diversified. However, a piezoelectric material in which KNN is provided so as to be more than 80% is preferable from a viewpoint of showing characteristics which are derived from KNN. In a case where there is a compound oxide containing the above-described other elements, it is preferable that the ABO₃ type perovskite structure be also provided.

In particular, a substance containing Mn is preferable as the additive. Thus, the piezoelectric layer 70 having improved piezoelectric characteristics is obtained. Examples of the compound oxide include a Mn-containing KNN-based compound oxide represented by the following formula (2).

$$(K_x, Na_{(1-x)})(Nb_{(1-y)}, Mn_y)O_3 \ldots \quad (2)$$

Here, in the formula (2), x satisfies $0.1 \leq x \leq 0.9$ and preferably satisfies $0.3 \leq x \leq 0.6$, and y satisfies $0 \leq y \leq 0.02$ and preferably satisfy $0.003 \leq y \leq 0.01$. With such a composition, the piezoelectric layer 70 having improved piezoelectric characteristics is obtained.

Alkali metal in the A site may be excessively added in comparison to the composition of the stoichiometry. The alkali metal in the A site may be insufficient in comparison to the composition of the stoichiometry. Thus, the compound oxide in the embodiment may be represented by the following formulas (3) and (4). In the following formulas (3) and (4), A indicates the amount of K and Na which may be excessively added, or the amount of K and Na which may be insufficiently added. In a case where the amount of K and Na is excessive, 1.0 A is satisfied. In a case where the amount of K and Na is insufficient, A<1.0 is satisfied. For example, A=1.1 means that K and Na of 110 mol % are contained when the amount of K and Na in the composition of the stoichiometry is set to be 100 mol %. A=0.9 means that K and Na of 90 mol % are contained when the amount of K and Na in the composition of the stoichiometry is set to be 100 mol %. In a case where alkali metal of the A site is not excessively and not insufficiently contained in comparison to the composition of the stoichiometry, A is 1. From a viewpoint of improving characteristics, $0.85 \leq A \leq 1.20$ is satisfied, $0.90 \leq A \leq 1.15$ is preferably satisfied, $0.95 \leq A \leq 1.10$ is more preferably satisfied.

$$(K_{Ax}, Na_{A(1-x)})NbO_3 \ldots \quad (3)$$

$$(K_{Ax}, Na_{A(1-x)})(Nb_{(1-y)}, Mn_y)O_3 \ldots \quad (4)$$

As the piezoelectric material, a material having a composition in which some of elements are absent, a material having a composition in which some of elements are surplus, and a material having a composition in which some of elements are substituted with other elements are also included. A material shifted from a composition of stoichiometry by defect or surplus, or a material in which some of elements are substituted with other elements are included in the piezoelectric material according to the embodiment, as long as the basic characteristics of the piezoelectric layer 70 are not changed.

In the specification, "a perovskite type compound oxide containing K, Na, and Nb" means "a compound oxide of the ABO₃ type perovskite structure containing K, Na, and Nb", and this is not limited only to the compound oxide of the ABO₃ type perovskite structure containing K, Na, and Nb. That is, in the specification, the "perovskite type compound oxide containing K, Na, and Nb" includes a piezoelectric material which is represented as a mixed crystal which contains compound oxide (for example, KNN-based compound oxide which is exemplified above) of the ABO₃ type perovskite structure containing K, Na, and Nb, and other compound oxides having the ABO₃ type perovskite structure.

In the scope of the invention, other compound oxides are not limited. However, as the other compound oxides, a non-lead-based piezoelectric material which does not contain lead (Pb) is preferable. As the other compound oxides, a non-lead-based piezoelectric material which does not contain lead (Pb) and bismuth (Bi) is more preferable. If the compound oxide is used, the piezoelectric element 300 having excellent biocompatibility, and has a small environmental load is obtained.

The piezoelectric layer 70 formed of the above-described compound oxide is preferentially oriented to the (100) crystal plane in the embodiment. Since the piezoelectric layer 70 formed of a KNN-based compound oxide is easily and naturally oriented to the (100) plane, the orientation control layer is not used. In addition, the piezoelectric layer 70 may also be preferentially oriented to the (110) plane or the (111) plane or may also be preferentially strongly oriented to the (100) plane, by a predetermined orientation control layer which is provided if necessary. The piezoelectric layer 70 which is preferentially oriented to the predetermined crystal plane causes various types of characteristics to be improved easier than a piezoelectric layer which is randomly oriented. In the embodiment, the piezoelectric layer 70 is preferentially oriented to the (100) plane. In the specification, preferential orientation means that a crystal of which the content is equal to or greater than 50%, and preferably equal to or greater than 80% is oriented to a predetermined crystal plane. For example, "being preferentially orientated in (100) plane" includes a case where all crystals in the piezoelectric layer 70 are oriented to the (100) plane, and a case where crystals of the half or more (being equal to or greater than 50%, and preferably equal to or greater than 80%) are oriented to the (100) plane.

Since the piezoelectric layer 70 is polycrystalline, stress in the plane is dispersed and becomes uniform. Thus, occurrence of breaking of the piezoelectric element 300 due to the stress is difficult, and reliability is improved.

In the piezoelectric layer 70, in an X-ray diffraction pattern obtained by θ-2θ measurement, peaks derived from a (002) plane and a (200) plane are provided in a range in which 2θ is from 45° to 47°. The peak position of the peak on the high angle side among the peaks satisfies $46.0°≤2θ≤46.5°$. The difference of 2θ between the peak on the high angle side and the peak on the low angle side is greater than 0.60° and preferably greater than 0.70°. The piezoelectric layer 70 has such an X-ray diffraction pattern, and thus suppresses the occurrence of cracks.

As described above, points that two peaks derived from the (002) plane and the (200) plane are observed in a range in which 2θ is from 45° to 47° and the peak position of the peak on the high angle side is observed to satisfy $46.0°≤2θ46.5°$ are considered as that a peak in the (200) plane is provided and the peak on the low angle side is a peak derived from the (002) plane. A point that the difference between the peaks is large is considered as that the (002) plane is separated from the (200) plane (a lattice constant difference between a c axis and an a axis is large). In addition, it is estimated that the piezoelectric layer 70 has a structure (ratio of a c-axial length and an a-axial length) having crack resistance, for example, a structure in which the peak difference is greater than 0.6, and preferably greater than 0.7.

The X-ray diffraction pattern is influenced in a state of a crystal in the piezoelectric layer 70. However, the state of a crystal in the piezoelectric layer 70 mainly varies depending on a composition ratio of elements constituting the piezoelectric body, a condition (for example, baking temperature, heating rate in baking, or the like) and the like when the piezoelectric layer is formed. The conditions are appropriately adjusted, and thus it is possible to control a crystal system of the piezoelectric layer 70 so as to observe the X-ray diffraction pattern as described above.

It is preferable that a peak on the high angle side among two peaks which are in a range in which 2θ is from 45° to 47° be observed to have peak intensity which is higher than that of a peak on the low angle side. In this configuration, it is possible to suppress the occurrence of cracks and to increase the displacement amount. Here, the peak on the high angle side is considered to be a peak in the (200) plane. Since a point that the peak on the high angle side is high means that many a-axis orientation components are provided, it is expected that peak intensity of the peak on the high angle side is increased, and thus the displacement amount is increased by the engineered domain effect.

Figure 5:
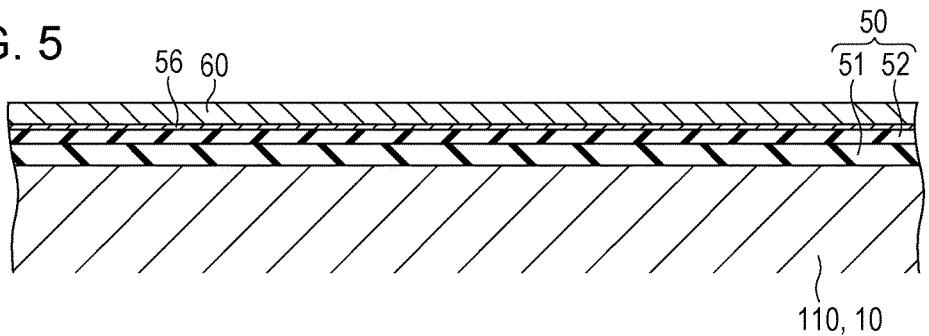
FIG. 5 is a sectional view illustrating a manufacturing example of the recording head.

Next, an example of a manufacturing method of a piezoelectric element 300 will be described with reference to FIGS. 5 to 11. The descriptions will be made with a manufacturing method of the ink jet recording head 1. Firstly, a silicon substrate (also referred to as "a wafer" below) 110 is prepared. Then, the silicon substrate 110 is thermally oxidized, and thus an elastic film 51 formed of silicon dioxide is formed on the silicon substrate 110. A zirconium film is formed on the elastic film 51 by sputtering, and the zirconium film is thermally oxidized. Thus, an insulating film 52 is formed. In this manner, a vibration plate 50 configured from the elastic film 51 and the insulating film 52 is obtained. Then, an adhesive layer 56 formed of titanium oxide is formed on the insulating film 52 by using a sputtering method or by thermally oxidizing a titanium film. Thus, as illustrated in FIG. 5, a first electrode 60 is formed on the adhesive layer 56 by using a sputtering method, an evaporation method, or the like.

Figure 6:
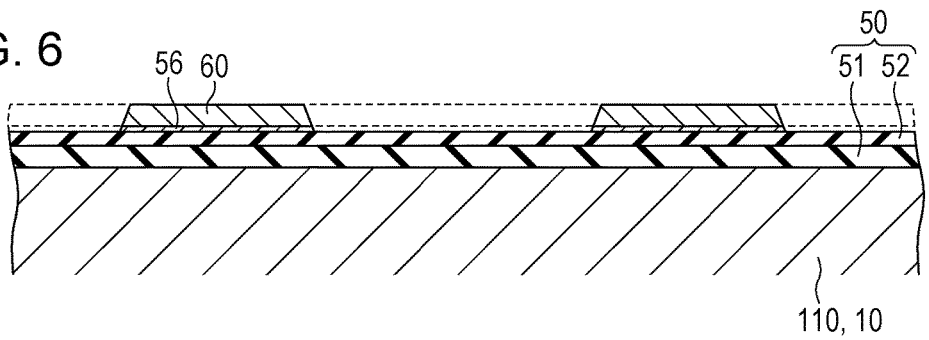
FIG. 6 is a sectional view illustrating the manufacturing example of the recording head.
Figure 7:
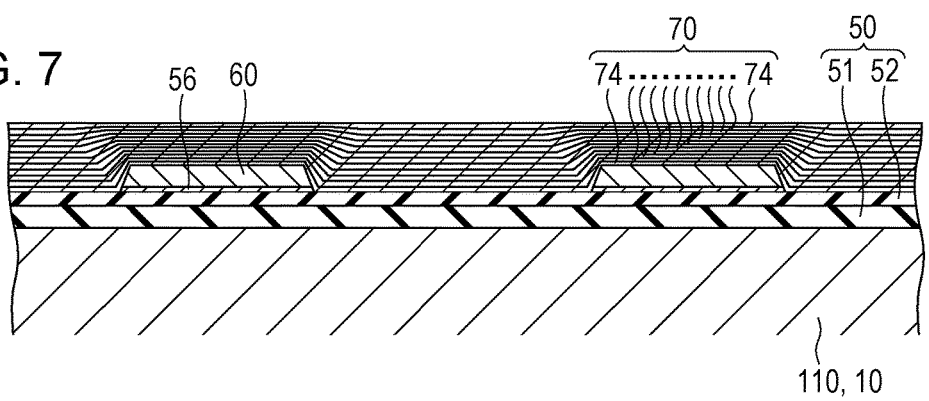
FIG. 7 is a sectional view illustrating the manufacturing example of the recording head.

Then, as illustrated in FIG. 6, a resist (not illustrated) having a predetermine shape is formed as a mask on the first electrode 60. The adhesive layer 56 and the first electrode 60 are simultaneously patterned. Then, as illustrated in FIG. 7, a plurality of piezoelectric films 74 are formed so as to be superposed on the adhesive layer 56, the first electrode 60, and the vibration plate 50. The piezoelectric layer 70 is formed by the plurality of piezoelectric films 74. The piezoelectric layer 70 may be formed by using a solution method (chemical solution method) such as a MOD method and a sol-gel method, for example. The piezoelectric layer 70 is formed by using such a solution method, and thus it is possible to improve the productivity of the piezoelectric layer 70. The piezoelectric layer 70 formed by using such a solution method is formed by repeating a series of processes a plurality of number of times. The series of processes includes processes from a process (coating process) of performing coating with a precursor solution to a process (baking process) of baking the precursor film.

Specific procedures in a case where the piezoelectric layer 70 is formed by using the solution method are as follows, for example. Firstly, a precursor solution containing a predetermined metal complex is prepared. In the precursor solution, a metal complex for forming compound oxide containing K, Na, and Nb by baking is dissolved or dispersed in an organic solvent by baking. At this time, a metal complex containing an additive such as Mn may be mixed.

Examples of the metal complex containing K include potassium 2-ethylhexanoate, and potassium acetate. Examples of the metal complex containing Na include sodium 2-ethylhexanoate, and sodium acetate. Examples of the metal complex containing Nb include 2-ethyl hexane acid niobium and pentaethoxy niobium. In a case where Mn is added as the additive, examples of the metal complex containing Mn include manganese 2-ethylhexanoate. At this time, two or more types of metal complex may be used together. For example, as the metal complex containing K, potassium 2-ethylhexanoate and potassium acetate may be used together. As a solvent, 2-n-butoxyethanol, n-octane, a solvent mixture of 2-n-butoxyethanol and n-octane, and the like are exemplified. The precursor solution may contain an additive agent for stabilizing dispersion of the metal complex containing K, Na, and Nb. As such an additive agent, 2-ethyl hexane acid and the like are exemplified.

The coating with the precursor solution is performed on the wafer 110 on which the vibration plate 50, the adhesive layer 56, and the first electrode 60 are formed, thereby a precursor film is formed (coating process). Then, the precursor film is heated to a predetermined temperature, for example, to a temperature of about 130° C. to 250° C., and is dried for a predetermined period (drying process). Then, the dried precursor film is heated to a predetermined temperature, for example, to a temperature of about 300° C. to 450° C., and is held for a predetermined period, and thereby being degreased (degreasing process). Finally, if the degreased precursor film is heated to a higher temperature, for example, to a temperature of 600° C. to 800° C., and is held at this temperature, and thereby being crystallized, a piezoelectric film 74 is completed (baking process). It is appropriate that a heating rate in the drying process is set to be 30° C./sec to 350° C./sec. The piezoelectric film 74 is baked at such a heating rate by using the solution method, and thus it is possible to realize the piezoelectric layer 70 which is not pseudo-cubic. The "heating rate" stated herein defines a time change rate of the temperature when the temperature reaches a desired baking temperature from 350° C.

As a heating device used in the drying process, the degreasing process, and the baking process, for example, a rapid thermal annealing (RTA) device, a hot plate, and the like are exemplified. The RTA device performs heating by irradiation with an infrared lamp. The above processes are repeated a plurality of number of times, and thus the piezoelectric layer 70 formed from a plurality of piezoelectric films 74 is formed. In the series of the processes from the coating process to the baking process, the processes from the coating process to the degreasing process may be repeated a plurality of number of times, and then, the baking process may be performed.

Before or after the second electrode 80 is formed on the piezoelectric layer 70, if necessary, re-heating treatment (post annealing) may be performed in a temperature range of 600° C. to 800° C. It is possible to form a good interface between the piezoelectric layer 70, and the first electrode or the second electrode 80, and to improve crystallinity of the piezoelectric layer 70, by performing such post annealing.

In the embodiment, the piezoelectric material contains alkali metal (K or Na). The alkali metal is easily diffused in the first electrode 60 or the adhesive layer 56, in the baking process. If the alkali metal reaches the wafer 110 through the first electrode 60 and the adhesive layer 56, the alkali metal is caused to react with the wafer 110. However, in the embodiment, the insulating film 52 formed from the zirconium oxide layer conducts the stopper function of K or Na. Thus, it is possible to suppress reaching of the alkali metal to the wafer 110 which is a silicon substrate.

Figure 8:
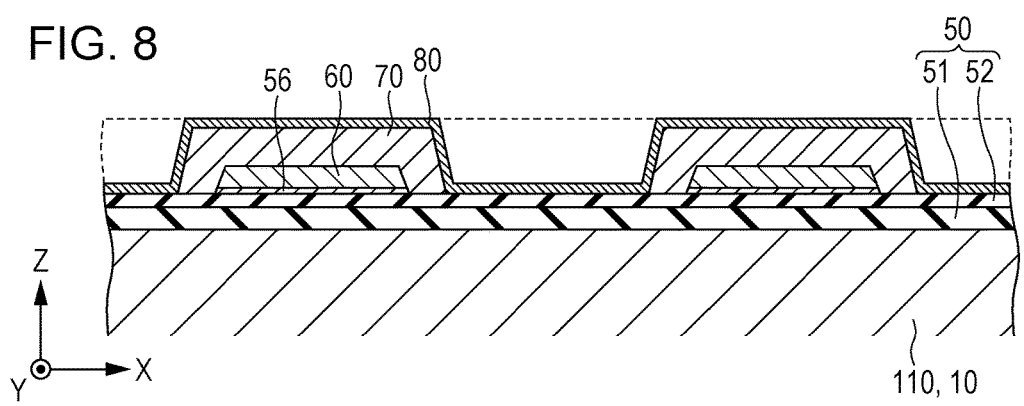
FIG. 8 is a sectional view illustrating the manufacturing example of the recording head.

After that, the piezoelectric layer 70 formed from a plurality of piezoelectric films 74 is patterned so as to have a shape as illustrated in FIG. 8. Patterning may be performed by using dry etching such as reactive ion etching and ion milling, or wet etching in which an etching liquid is used. Then, the second electrode 80 is formed on the piezoelectric layer 70. The second electrode 80 may be formed by using a method similarly to the first electrode 60. With the above processes, the piezoelectric element 300 which includes the first electrode 60, the piezoelectric layer 70, and the second electrode 80 is completed. In other words, a portion at which the first electrode 60, the piezoelectric layer 70, and the second electrode 80 overlap each other functions as the piezoelectric element 300.

A layer or a film formed by the solution method has an interface. Traces of coating or baking remains on the layer or the film formed by the solution method. Such a trace functions as "an interface" which can be confirmed by observing the section of the trace or by analyzing concentration distribution of an element in the layer (or in the film). The "interface" strictly means a boundary between layers or between films. However, here, it is assumed that the interface means the vicinity of a boundary between layers or between films. In a case where the section of a layer of a film formed by the solution method is observed by an electronic microscope or the like, such an interface is confirmed in the vicinity of a boundary with the adjacent layer or with the adjacent film, as a portion having a color darker than those of other portions, or as a portion having a color lighter than those of other portions. In a case where the concentration distribution of an element is analyzed, such an interface is confirmed in the vicinity of a boundary with the adjacent layer or with the adjacent film, as a portion at which the concentration of the element is higher than that at other portions, or as a portion at which the concentration of the element is lower than that at other portions. The piezoelectric layer 70 is formed in a manner that a series of processes from the coating process to the baking process are repeated a plurality of number of times, or in a manner that processes from the coating process to the degreasing process are repeated a plurality of number of times, and then the baking process is performed (configured by a plurality of piezoelectric films). Thus, the piezoelectric layer 70 has a plurality of interfaces for each piezoelectric film.

Figure 9:
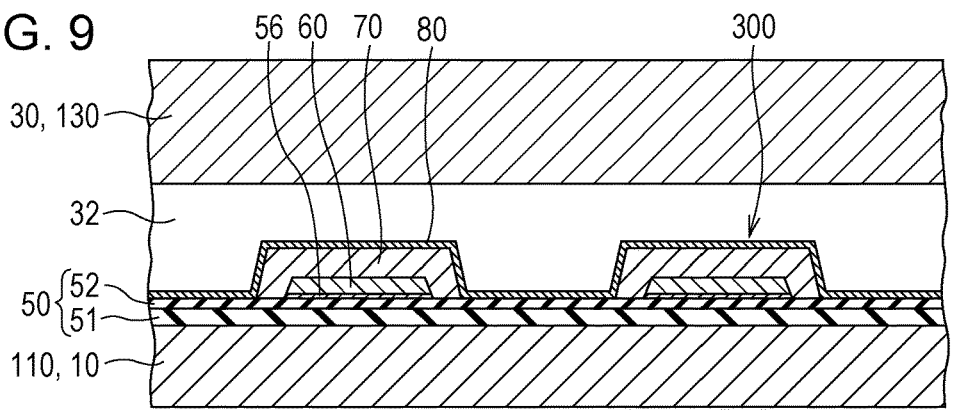
FIG. 9 is a sectional view illustrating the manufacturing example of the recording head.
Figure 10:
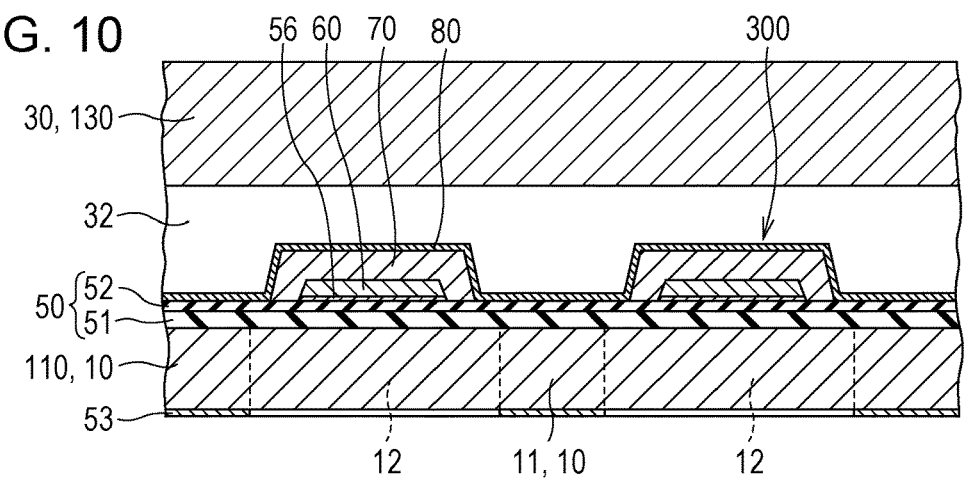
FIG. 10 is a sectional view illustrating the manufacturing example of the recording head.
Figure 11:
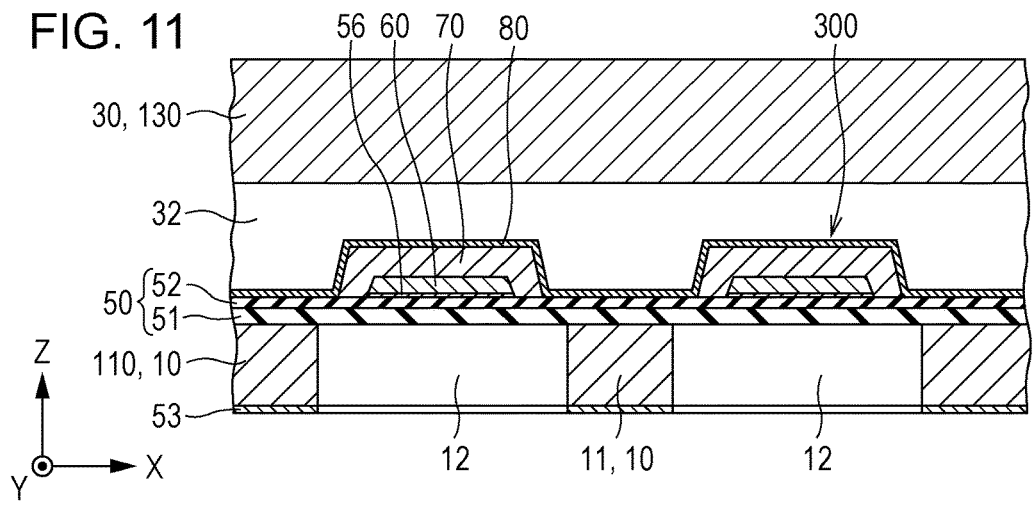
FIG. 11 is a sectional view illustrating the manufacturing example of the recording head.

Then, as illustrated in FIG. 9, a wafer 130 for the protective substrate is bonded to a surface on the piezoelectric element 300 side of the wafer 110, through the adhesive 35 (see FIG. 4). Then, the surface of the wafer 130 for the protective substrate is abraded so as to become thin. The manifold portion 32 or the through-hole 33 (see FIG. 4) is formed on the wafer 130 for the protective substrate. Then, as illustrated in FIG. 10, a mask film 53 is formed on a surface of the wafer 110 on an opposite side of the piezoelectric element 300, and is patterned so as to have a predetermined shape. As illustrated in FIG. 11, anisotropic etching (wet etching) with an alkaline solution such as KOH is performed on the wafer 110 through the mask film 53. Thus, the ink supply path 13, the communication path 14, and the communication portion 15 (see FIG. 4) are formed in addition to the pressure generation chamber 12 corresponding to each piezoelectric element 300.

Then, an unnecessary portion of an outer circumferential portion of the wafer 110 and the wafer 130 for the protective substrate is cut out and removed by dicing and the like. The nozzle plate 20 is bonded to the surface of the wafer 110 on the opposite side of the piezoelectric element 300 (see FIG. 4). The compliance substrate 40 is bonded to the wafer 130 for the protective substrate (see FIG. 4). With the process until here, an assembly of chips for the ink jet recording head 1 is completed. The assembly is divided for each of the chips, and thus, the ink jet recording head 1 is obtained.

EXAMPLES

Examples of the invention will be described below.

Example 1

A surface of a silicon substrate of 6 inches, which was used as the passage formation substrate 10 was thermally oxidized, and thus the elastic film 51 formed of silicon dioxide was formed on the silicon substrate. Then, a zirconium film was formed on the elastic film 51 by sputtering, and the zirconium film was thermally oxidized. Thus, the insulating film 52 formed of zirconium oxide was formed. Then, a film was formed on the insulating film 52 by a sputtering method and thermal oxidization was performed so as to form an adhesive layer 56 formed of titanium oxide. After a platinum film was formed on the adhesive layer 56 by using a sputtering method, the platinum film was patterned so as to have a predetermined shape. Thus, the first electrode 60 having a thickness of 50 nm was formed.

Then, the piezoelectric layer 70 was formed by the following procedures. Firstly, mixing was performed so as to have a composition of $(K_{0.432}Na_{0.648})(Nb_{0.995}Mn_{0.005})O_3$, by using a solution which is formed of potassium 2-ethylhexanoate, sodium 2-ethyl hexanoate, niobium 2-ethylhexanoate, and manganese 2-ethylhexanoate. The mixture was applied onto the layer by the sputtering method (coating process). Then, the resultant was dried (drying process) at 180° C. and degreased (degreasing process) at 380° C. on a hot plate. A heating treatment was performed at 600° C. by using a rapid thermal annealing (RTA) device for three minutes (baking process). These processes from the coating process to the baking process were repeated 6 times. Thus, a KNN-based piezoelectric layer 70 having a film thickness of about 450 nm was manufactured.

A platinum film was formed on the piezoelectric layer 70 by a sputtering method while heating was performed up to 200° C., and thereby a second electrode 80 having a thickness of 100 nm was formed.

Then, in order to improve adhesiveness between the platinum film and the piezoelectric layer 70, re-heating (post annealing) was performed at 650° C. by the RTA device for three minutes. Thus, a piezoelectric element in Example 1 was formed.

Example 2

A piezoelectric layer was manufactured in a manner similar to that in Example 1 except that the composition of the piezoelectric layer 70 was set to be $(K_{0.424}Na_{0.636})(Nb_{0.995}Mn_{0.005})O_3$.

Example 3

A piezoelectric layer was manufactured in a manner similar to that in Example 1 except that a heating treatment temperature by the RTA device was set to be 700° C. The composition of the piezoelectric layer is $(K_{0.432}Na_{0.648})(Nb_{0.995}Mn_{0.005})O_3$ which is similar to that in Example 1.

Example 4

A piezoelectric layer was manufactured in a manner similar to that in Example 2 except that a heating treatment temperature by the RTA device was set to be 700° C. The composition of the piezoelectric layer is $(K_{0.424}Na_{0.636})(Nb_{0.995}Mn_{0.005})O_3$ which is similar to that in Example 2.

Example 5

A piezoelectric layer was manufactured in a manner similar to that in Example 1 except that the composition of the piezoelectric layer was set to be $(K_{0.530}Na_{0.530})(Nb_{0.995}Mn_{0.005})O_3$.

Comparative Example 1

A piezoelectric layer was manufactured in a manner similar to that in Example 1 except that the composition of the piezoelectric layer was set to be $(K_{0.636}Na_{0.424})(Nb_{0.995}Mn_{0.005})O_3$.

Comparative Example 2

A piezoelectric layer was manufactured in a manner similar to that in Example 1 except that the composition of the piezoelectric layer was set to be $(K_{0.212}Na_{0.848})(Nb_{0.995}Mn_{0.005})O_3$.

Comparative Example 3

A piezoelectric layer was manufactured in a manner similar to that in Example 2 except that a heating treatment temperature by the RTA device was set to be 550° C. The composition of the piezoelectric layer is $(K_{0.424}Na_{0.636})(Nb_{0.995}Mn_{0.005})O_3$ which is similar to that in Example 2.

The following test was performed on the piezoelectric layer of the examples and the comparative examples which were described above. Table shows results. XRD Analysis Evaluation was performed at room temperature by XRD measurement in a state where "D8 Discover" manufactured by Bruker AXS corporation, CuKα as a beam source, a two-dimensional detector (GADDS) as a detector were used. Peak fitting was performed by using the Pearson VII function. Peaks in a range in which 2θ is from 45° to 47° were separated from each other. The peak position at that time was calculated.

Displacement Amount Measurement

Measurement was performed at a frequency of 1 kHz by a laser interference displacement meter. The displacement amount at an applied voltage of 15 V was obtained.

Surface Cracks Observation

Cracks on the surface of the piezoelectric layer were observed by a metallurgical microscope. The layer in which cracks were not observed was set to be A and the layer in which cracks were observed was set to be B.

TABLE

| Sample | 2θ position (°) of peak on high angle side | 2θ peak difference (°) | Peak intensity on high angle side > peak intensity on low angle side | Displacement amount (nm) | Crack |
|---|---|---|---|---|---|
| Example 1 | 46.2 | 0.76 | Satisfaction | 110 | A |
| Example 2 | 46.2 | 0.93 | Satisfaction | 112 | A |
| Example 3 | 46.1 | 0.73 | Satisfaction | 120 | A |
| Example 4 | 46.3 | 0.77 | Satisfaction | 126 | A |
| Example 5 | 46.2 | 0.75 | Dissatisfaction | 73 | A |
| Comparative Example 1 | 45.8 | 0.43 | Satisfaction | 70 | B |
| Comparative Example 2 | 46.5 | 0.46 | Satisfaction | Measurement impossible due to too many cracks | B |
| Comparative Example 3 | 46.3 | 0.60 | Satisfaction | 90 | B |

Test Result

From the results in Table, the occurrence of cracks was not viewed in Examples 1 to 5 in which, in the X-ray diffraction pattern obtained by θ-2θ measurement, peaks derived from the (002) plane and the (200) plane were provided in a range in which 2θ was from 45° to 47°, the peak position of the peak on the high angle side among the peaks satisfied 46.0°≤2θ≤46.5°, and the difference of 2θ between the peak on the high angle side and the peak on the low angle side was greater than 0.60°. Among the examples, in Examples 1 to 4 in which the peak on the high angle side had peak intensity which was higher than that of the peak on the low angle side, the displacement amount was significantly improved.

The occurrence of cracks was observed in Comparative Example 1 in which peaks derived from the (002) plane and the (200) plane were provided in a range in which 2θ was from 45° to 47°, but the peak position of the peak on the high angle side among the peaks did not satisfy 46.0°≤2θ≤46.5°, and the difference of 2θ between the peak on the high angle side and the peak on the low angle side was equal to or smaller than 0.60°. The occurrence of cracks was also observed in Comparative Examples 2 and 3 in which peaks derived from the (002) plane and the (200) plane were provided in a range in which 2θ was from 45° to 47°, the peak position of the peak on the high angle side among the peaks satisfies 46.0°≤2 θ≤46.5°, but the difference of 2θ between the peak on the high angle side and the peak on the low angle side was equal to or smaller than 0.60°.

Other Embodiments

Hitherto, the embodiment of the piezoelectric material or the piezoelectric element, and the liquid ejecting unit and the liquid ejecting apparatus which have the piezoelectric element mounted therein, according to the invention is described. However, the basic configuration of the invention is not limited to the above-described form. For example, in Embodiment 1, the silicon substrate as the passage formation substrate 10 is exemplified. However, it is not limited thereto, and may use, for example, a SOI substrate or a material such as glass.

In Embodiment 1, as an example of the liquid ejecting unit, the ink jet recording head is exemplified and described. However, the invention may be widely applied to all types of the liquid ejecting head, and may be applied to a liquid ejecting unit which ejects a liquid other than an ink. Examples of such a liquid ejecting head include various recording heads used in an image recording apparatus such as a printer; a coloring material ejecting head used in manufacturing a color filter in a liquid crystal display and the like; an electrode material ejecting head used in forming an electrode in an organic EL display, a field emission display (FED), and the like; and a bio-organic material ejecting head used in manufacturing a bio-chip.

The invention is not limited to the piezoelectric element mounted in the liquid ejecting head, and may be also applied to a piezoelectric element mounted in other piezoelectric element applied devices. As an example of the piezoelectric element applied device, an ultrasonic device, a motor, a pressure sensor, a pyroelectric element, and a ferroelectric element may be exemplified. A finished article using the piezoelectric element applied device, for example, an ejecting apparatus of a liquid and the like, which uses an ejecting head for the liquid and the like; an ultrasonic sensor using the ultrasonic device; a robot using the motor as a driving source; an IR sensor using the pyroelectric element; a ferroelectric memory using the ferroelectric element may be included as the piezoelectric element applied device.

The thickness, the width, the relative positional relationship, and the like of the constituents illustrated in the drawings, that is, the layers and the like may be exaggeratedly illustrated in describing the invention. The term of "being on" in the specification is not limited to the meaning that the positional relationship between the constituents is "just on". For example, an expression of "the first electrode on the substrate" or "the piezoelectric layer on the first electrode" includes a case where other constituents are provided between the substrate and the first electrode or between the first electrode and the piezoelectric layer.

What is claimed is:

1. A piezoelectric element comprising:
a first electrode;
a second electrode; and
a thin piezoelectric layer which is provided between the first electrode and the second electrode and is formed of a perovskite type compound oxide which contains potassium, sodium, and niobium,
wherein, in the piezoelectric layer, in an X-ray diffraction pattern obtained by θ-2θ measurement,
peaks derived from a (002) plane and a (200) plane are provided in a range in which 2θ is from 45° to 47°,
a peak position of the peak on a high angle side among the peaks satisfies 46.0°≤2θ≤46.5°, and
a difference of 2θ between the peak on the high angle side and the peak on a low angle side is greater than 0.60°.

2. The piezoelectric element according to claim 1, wherein the compound oxide contains manganese.

3. The piezoelectric element according to claim 2, wherein a composition of the compound oxide is represented by the following formula, $(K_xNa_{(1-x)})_Z(Nb_{(1-y)}Mn_y)O_3$ 0.1≤x≤0.9, 0≤y≤0.02, and 0.9≤z≤1.2.

4. The piezoelectric element according to claim 3, wherein x, y, and z in the formula are indicated as follows, 0.3≤x≤0.6, and 0.003≤y≤0.01, and 0.95≤z≤1.1.

5. A piezoelectric element applied device comprising: the piezoelectric element according to claim 4.
6. A piezoelectric element applied device comprising: the piezoelectric element according to claim 2.
7. A piezoelectric element applied device comprising: the piezoelectric element according to claim 3.
8. The piezoelectric element according to claim 1, wherein the first electrode and the second electrode are formed of at least one selected from Pt, Ir, and oxides thereof.
9. A piezoelectric element applied device comprising: the piezoelectric element according to claim 8.
10. The piezoelectric element according to claim 1, wherein the peak on the high angle side among the peaks has peak intensity which is higher than peak intensity of the peak on the low angle side.
11. A piezoelectric element applied device comprising: the piezoelectric element according to claim 10.
12. A piezoelectric element applied device comprising: the piezoelectric element according to claim 1.

* * * * *